(12) United States Patent
Fischer et al.

(10) Patent No.: US 8,323,991 B2
(45) Date of Patent: Dec. 4, 2012

(54) METHOD FOR DETECTING STRESS MIGRATION PROPERTIES

(75) Inventors: Armin Fischer, Munich (DE); Alexander Von Glasow, Gruenwald (DE); Jochen Von Hagen, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 12/980,829

(22) Filed: Dec. 29, 2010

(65) Prior Publication Data

US 2011/0097826 A1 Apr. 28, 2011

Related U.S. Application Data

(60) Division of application No. 11/132,665, filed on May 19, 2005, now Pat. No. 7,888,672, which is a continuation of application No. PCT/DE03/03844, filed on Nov. 20, 2003.

(30) Foreign Application Priority Data

Nov. 23, 2002 (DE) .................................. 102 54 756

(51) Int. Cl.
*G01R 31/26* (2006.01)
*G01R 27/08* (2006.01)

(52) U.S. Cl. ................ 438/17; 438/18; 438/14; 438/11; 438/10; 257/E21.521; 257/E21.524

(58) Field of Classification Search .......... 438/5, 10–12, 438/14–15, 17–18; 257/48, E23.179, E21.521, 257/E21.522, E21.524
See application file for complete search history.

(56) References Cited

U.S. PATENT DOCUMENTS

| | | | |
|---|---|---|---|
| 5,532,600 A * | 7/1996 | Hoshino | 324/537 |
| 5,874,777 A | 2/1999 | Ohmi et al. | |
| 5,878,485 A | 3/1999 | Wood et al. | |
| 6,046,433 A * | 4/2000 | Gross et al. | 219/209 |
| 6,133,054 A * | 10/2000 | Henson | 438/17 |
| 6,232,147 B1 * | 5/2001 | Matsuki et al. | 438/108 |
| 6,680,484 B1 * | 1/2004 | Young | 257/48 |

(Continued)

FOREIGN PATENT DOCUMENTS

EP 0 656 650 A1 7/1995

(Continued)

OTHER PUBLICATIONS

German Office Action and English Translation Dated Mar. 12, 2010.
Translation of the Notification of the First Office Action (issued to PRC Patent Application No. 200380103956.4), pp. 3-6.

(Continued)

*Primary Examiner* — Matthew Landau
*Assistant Examiner* — Maliheh Malek

(57) ABSTRACT

A device and method are provided for detecting stress migration properties of a semiconductor module mounted in a housing. A stress migration test (SMT) structure is formed in the semiconductor module. An integrated heating (IH) device is formed within or in direct proximity to the SMT structure. The SMT structure includes a first interconnect region in a first interconnect layer, a second interconnect region in a second interconnect layer, and a connecting region electrically connecting the interconnect regions through a first insulating layer. The IH device includes a heating interconnect region through which a heating current flows. The heating interconnect region is within or outside the first or second interconnect region or connecting region. When the heating current is applied, a measurement voltage is applied to the SMT structure, and a current through the SMT structure is measured to detect stress migration properties of the semiconductor module.

7 Claims, 4 Drawing Sheets

U.S. PATENT DOCUMENTS

| | | | |
|---|---|---|---|
| 6,693,446 | B2 | 2/2004 | Song et al. |
| 6,747,445 | B2 * | 6/2004 | Fetterman et al. ............ 324/71.1 |
| 6,787,799 | B2 * | 9/2004 | Asam et al. ...................... 257/48 |
| 6,867,056 | B1 * | 3/2005 | Hau-Riege et al. .............. 438/17 |
| 6,873,170 | B2 * | 3/2005 | Asam et al. .............. 324/750.06 |
| 6,884,637 | B2 * | 4/2005 | Umemura et al. .............. 438/14 |
| 7,646,207 | B2 | 1/2010 | Lin et al. |
| 7,800,106 | B2 | 9/2010 | Feustel et al. |
| 2003/0045131 | A1 | 3/2003 | Verbeke et al. |
| 2003/0080766 | A1 * | 5/2003 | Fetterman et al. ............ 324/763 |
| 2003/0082836 | A1 * | 5/2003 | Fetterman et al. .............. 438/14 |
| 2004/0036495 | A1 | 2/2004 | Fazekas et al. |
| 2004/0124865 | A1 | 7/2004 | Chuang et al. |
| 2005/0029670 | A1 * | 2/2005 | Doan ............................ 257/774 |
| 2007/0051951 | A1 | 3/2007 | Chaparala et al. |
| 2007/0298534 | A1 | 12/2007 | Ikushima et al. |
| 2008/0265247 | A1 | 10/2008 | Feustel et al. |
| 2010/0203724 | A1 | 8/2010 | Funakoshi et al. |

FOREIGN PATENT DOCUMENTS

| | | |
|---|---|---|
| GB | 2 368 973 | 5/2002 |
| GB | 2 368 974 A | 5/2002 |
| JP | 06177221 | 6/1994 |
| JP | 06188297 | 7/1994 |
| JP | 06-342027 | 12/1994 |
| JP | 10107108 | 4/1998 |
| JP | 11031727 | 2/1999 |

OTHER PUBLICATIONS

International Search Report from corresponding PCT patent application No. PCT/DE03/03844.

International Examination Report from corresponding PCT patent application No. PCT/DE03/03844.

Michael Roesch, Robert W. Teichner and Rod Martens, *Flip Chip on Laminate Reliability-Failure Mechanisms*, pp. 53-61, The International Journal of Microcircuits and Electronic Packaging, vol. 23, No. 1, First Quarter 2000.

Nitin R. Kamat, *Investigating Reliability on the Five Metal Single Poly 0.25um CMOS Process*, pp. 277-280, International Workshop on Thermal Investigations of ICs and Microstructures, Oct. 3-6, 1999.

Jay A. Shideler, Timothy Turner and Cleston Messick, *A Systematic Approach to Wafer Level Reliability*, pp. 47-54, Solid State Technology, Mar. 1995.

M. Ehmann, P. Ruther, M. Von Arx, H. Baltes, and O. Paul, "Ageing Behavior of Polysilicon Heaters for CMOS Microstructures Operated at Temperatures up to 1200K," Institute for Microsystem Technology, University of Freiburg, Germany, Physical Electronics Laboratory, ETH Zurich, Switzerland, IEEE 0-7803-5998, 2001.

Wilson et al., "Some Problems in the Correct Failure Analysis of Plastic Encapsulated Semiconductor Devices" IEEE, May 5-8, 1986, p. 132-137, England.

* cited by examiner

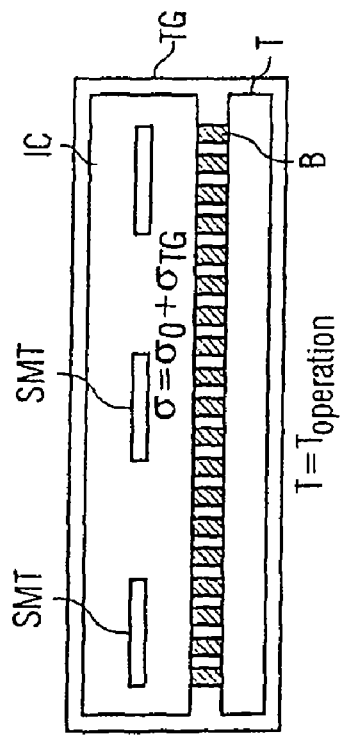
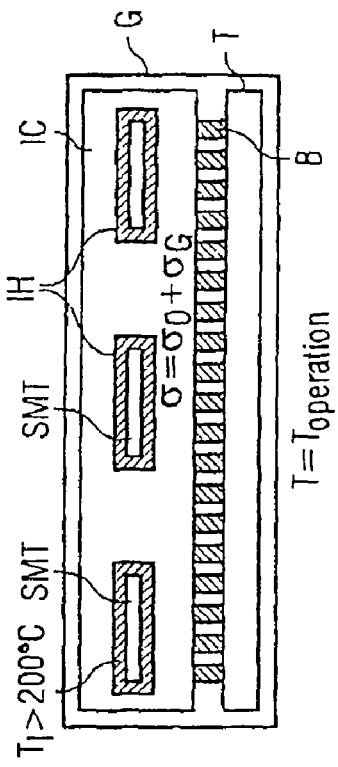
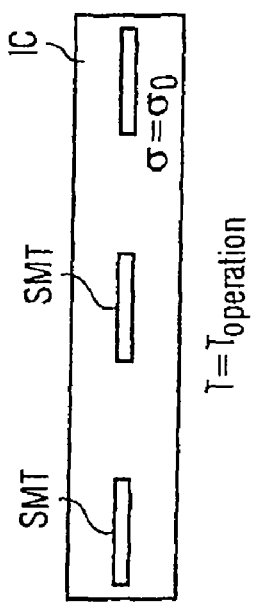
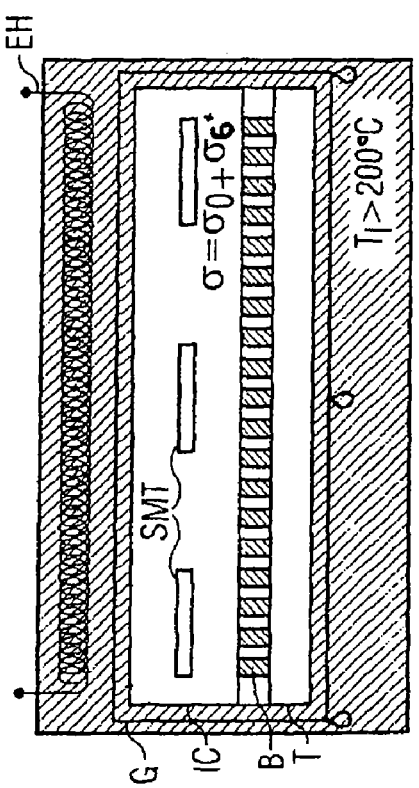

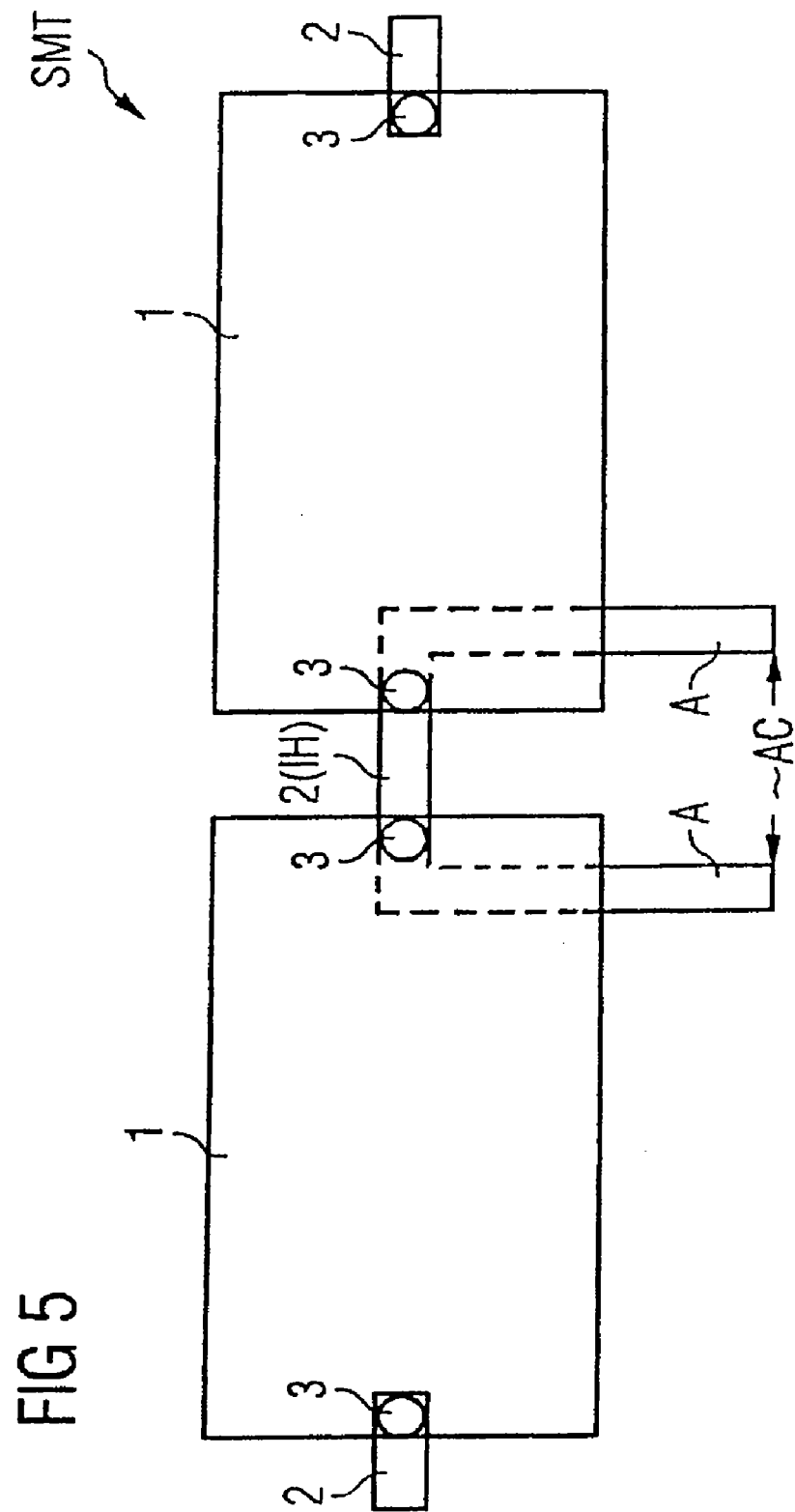

METHOD FOR DETECTING STRESS MIGRATION PROPERTIES

PRIORITY

This application is a divisional application of U.S. Ser. No. 11/132,665, filed May 19, 2005 now U.S. Pat. No. 7,888,672, which is a continuation of International Application PCT/DE03/03844, filed on Nov. 20, 2003, which claims the benefit of priority to German Patent Application 102 54 756.4, filed on Nov. 23, 2002, incorporated herein by reference.

TECHNICAL FIELD

The present invention relates to a device and a method for detecting stress migration properties and in particular to a device and a method for detecting stress migration properties of a semiconductor module mounted in a product-relevant housing.

BACKGROUND

Integrated circuits are usually fabricated with a multiplicity of patterned metallization or interconnect planes which are electrically isolated from one another by dielectric intermediate insulating layers. In order to realize electrical connections between the patterned metallization or interconnect layers or between the interconnect layers and a substrate, contact holes or vias are formed in the insulating layer at selected locations.

In the context of advancing integration density, in order to realize improved performance features such as increased speed and increased circuit functionality per unit area, the feature sizes and, in particular, the contact holes or vias are becoming increasingly smaller. This leads to the contact holes or vias becoming increasingly susceptible to stress migration.

In contrast to electromigration, in which a mass transport of interconnect material is brought about on account of a direct current that is present and at very high current densities, stress migration relates to a mass transport which is brought about in interconnect layers or contact holes in particular on account of mechanical stresses or stress gradients. Such mechanical stresses, which originate for example from a mismatch of thermal expansion coefficients and of different moduli of elasticity of the interconnect layers or the insulator layers lying in between and other conductive and nonconductive intermediate layers, accordingly lead to a similar material transport, which, depending on a compressive or tensile stress or alternating stress, brings about the formation of voids in the electrically conductive material. As a result, an electrical resistance of interconnects in the semiconductor module may be increased or even an interconnect interruption may occur.

If a fabrication process is considered, by way of example, in which, on an interconnect layer (aluminum, copper etc.) formed on a semiconductor substrate or a dielectric layer, a further insulator layer is deposited, for example at a temperature of 350 degrees Celsius by means of a CVD (Chemical Vapor Deposition) method, the different expansion coefficients between the interconnect layer and the adjoining insulating layers already give rise to mechanical stresses which bring about a stress migration in the interconnect layer. In the case of copper metallization with Cu vias, stress gradients e.g. on account of thermal mismatch lead to the transport of vacancies into the via (formation of voids). In other words, vacancies diffuse to reduce the stress energy in the interconnect layer. As a result, after a certain time, usually several months or years, this mass transport in the interconnect layer or the vias produces voids which influence the electrical properties of the semiconductor module and may lead as far as an interruption of an interconnect.

FIGS. 1A to 1C show simplified sectional views for illustrating conventional devices for detecting stress migration properties.

In accordance with FIG. 1A, reliability examinations for characterizing the above-described stress migration properties of interconnects and in particular of metallizations in integrated circuits or semiconductor modules IC are usually carried out directly on the wafer or at the wafer level. In this case, the resistances of various stress migration test structures SMT which are formed in a semiconductor module IC are measured at regular intervals (e.g. once per hour, day or week) and the deviation from the initial value is assessed. Between these measurements, the wafers are stored in a furnace at temperatures of greater than 150 degrees Celsius. As a result, the duration for these reliability examinations can be significantly reduced to about 1000 to 2000 hours in order to cover a product service life of e.g. 15 years.

However, in the case of a test device of this type, the results obtained are only inadequate on account of a lack of final mounting in a housing and, in this respect, do not enable a sufficiently accurate detection of the stress migration properties of the semiconductor module in an environment close to the product.

In accordance with FIG. 1B, a test of this type may accordingly also be carried out in a finally mounted test housing TG, the semiconductor module IC being mounted on a module carrier T by means of bonding wires or soldering connections B, for example, a thermostable ceramic test housing being used as the housing. Although it is possible in this way to detect and assess not only internal stresses $\sigma_0$ of the semiconductor module IC but also the stresses $\sigma_{TG}$ caused by the mounting or the soldering connections B and the module carrier T of the test housing TG, examination results of this type again do not yield accurate statements for the stress migration properties of the interconnect systems in a semiconductor module with a product housing, in particular on account of the test housing TG deviating from a product-relevant housing.

In accordance with FIG. 1C, the semiconductor module IC to be examined may also be embedded in a product-relevant plastic housing G once again by means of soldering connections B and a module carrier T. However, in this case corresponding heating to temperatures $T_E$ of greater than 150 degrees Celsius, the thermal mismatch of the layers surrounding the interconnect system causes a change in the product-relevant stress state. Accordingly, accurate statements concerning the stress migration properties in a semiconductor module IC packaged in this way are not obtained. Furthermore, the plastic composition of the housing G may also melt or soften, as a result of which the stress caused by this plastic housing G likewise leads to a reduced stress $\sigma_G'$.

Without these elevated temperatures of greater than 150 degrees Celsius, which are preferably generated by an external heating coil EH, reliability examinations of this type cannot be carried out economically, however, since they would take several months and usually even several years.

BRIEF SUMMARY

A device and a method are provided for detecting stress migration properties of a semiconductor module finally mounted in a product-relevant housing, in which a sufficiently accurate assessment of stress migration properties is obtained in a relatively short time.

The use of an internal heating device, which is formed within or in direct proximity to a stress migration test structure in the semiconductor module permits local heating of the stress migration test structure. This results in a sufficient acceleration for reducing the test times, stress caused by the product-relevant housing thereby essentially remaining unaffected.

The stress migration test structure comprises at least one first interconnect region formed in a first interconnect layer, at least one second interconnect region formed in a second interconnect layer, and at least one connecting region formed between the interconnect layers for electrically connecting the first and second interconnect regions in a first insulating layer. Since the stress migration test structure is accordingly formed in the available interconnect layers of the semiconductor module, a high degree of meaningfulness with regard to the stress migration properties in the semiconductor module is obtained for the measurement values determined.

A surface and/or a volume of the first interconnect region and/or a volume of the second interconnect region is significantly larger than a surface and/or a volume of the connecting region, as a result of which a further significant reduction of the time duration for the reliability examination is obtained given knowledge of the layout for the further semiconductor circuit, since the stress acting at the enlarged surface and also the number of diffusible vacancies in the volume are correspondingly increased.

In order to further increase a measurement accuracy and the statistical significance during an examination of stress migration properties, the stress migration test structure may have a multiplicity of first and second interconnect regions which are connected to one another in concatenated fashion by means of a multiplicity of connecting regions.

The internal heating device may be formed as a heating interconnect region within the at least one first or second interconnect region or connecting region, an alternating current flowing through the heating interconnect region. Heating of the structures to be examined is obtained in this way, and the influence of electromigration can be reliably precluded when using an alternating current.

With regard to the method for detecting stress migration properties, the above-described stress migration detection device is formed in a semiconductor module, then the semiconductor module is mounted onto a module carrier and packaged in a product-relevant housing, and finally a heating current is applied to the integrated heating device and, in order to detect the stress migration properties of the semiconductor module, a measurement voltage is applied to the stress migration test structure and a current through the stress migration test structure is measured. In this way, for the first time, the corresponding stress migration properties can be determined with high accuracy in a sufficiently short time for product-relevant housings as well, such as plastic housings for example.

The foregoing summary has been provided only by way of introduction. Nothing in this section should be taken as a limitation on the following claims, which define the scope of the invention.

BRIEF DESCRIPTION OF THE DRAWINGS

The invention will be explained in more detail in the following text using a number of exemplary embodiments and with reference to the drawings, in which:

FIGS. 1A to 1C show simplified sectional views for illustrating a conventional device and a conventional method for detecting stress migration properties;

FIG. 2 shows a simplified sectional view for illustrating a device and a method for detecting stress migration properties of a semiconductor module finally mounted in a product-relevant housing;

FIG. 5 shows a simplified plan view of a device for detecting stress migration properties in accordance with a third exemplary embodiment.

In the figures, identical or functionally identical elements are provided with the same reference symbols.

DETAILED DESCRIPTION OF THE PREFERRED EMBODIMENTS

FIG. 2 shows a simplified sectional view of a device for detecting stress migration properties, identical reference symbols designating elements identical or corresponding to those in FIGS. 1A to 1C and a repeated description being dispensed with below.

In accordance with FIG. 2, the reliability examinations for characterizing stress migration properties (in particular of metallizations) in semiconductor modules IC (Integrated Circuits) are carried out, according to the invention, in a finally mounted state and after packaging in a product-relevant housing G.

In the case of so-called flip-chip housings G, in particular, mechanical stresses are induced in the semiconductor module IC right into the region of the yield stress of bulk materials, for which reason they constitute an increased reliability risk. This influence, which cannot be assessed in accordance with the prior art, is detected in accordance with FIG. 2 by virtue of the fact that the stress migration test structures SMT integrated in the semiconductor module IC have, internally or in direct proximity thereto, an integrated heating device IH which can locally generate an internal temperature $T_I$ of greater than 150 degrees Celsius. Accordingly, the external temperatures may be for example at an operation temperature of $T=T_{operation}$ which lies sufficiently below a plastic-compatible temperature of at most 150 degrees Celsius. In this way, the plastic materials used in product-relevant housings G can act in unchanged fashion on the semiconductor module IC and also on the module carrier T or the soldering connections or balls B and cause their corresponding mechanical stress $\sigma_G$ on the semiconductor module IC in unchanged fashion. Furthermore, outside the stress migration test structures SMT as well, a prevailing basic stress in the semiconductor material or the wiring and/or insulator layers remains at an unchanged value $\sigma_0$, so that the stress that can be detected by the stress migration structure SMT or the corresponding stress σ turns out to be:

$\sigma=\sigma_0+\sigma_G$.

A local heating of the stress migration test structure SMT to $T_I$ greater than 150 degrees Celsius can nevertheless be brought about by means of the integrated heating device IH, temperatures in a range of from 225 degrees Celsius to 300 degrees Celsius preferably being set. In this way, a statement about the stress migration properties of a semiconductor module IC finally mounted in a product-relevant housing can be made in a relatively short time, i.e. 100 to 2000 hours.

Contrary to the conventional storage of the semiconductor modules IC with their product-relevant housings G in a furnace, the housing stress states being altered through to flowing in an undesirable manner, it is thus possible for the first time to carry out tests close to the product for characterizing the stress migration properties in particular of metallizations of integrated circuits.

Figure 3A:
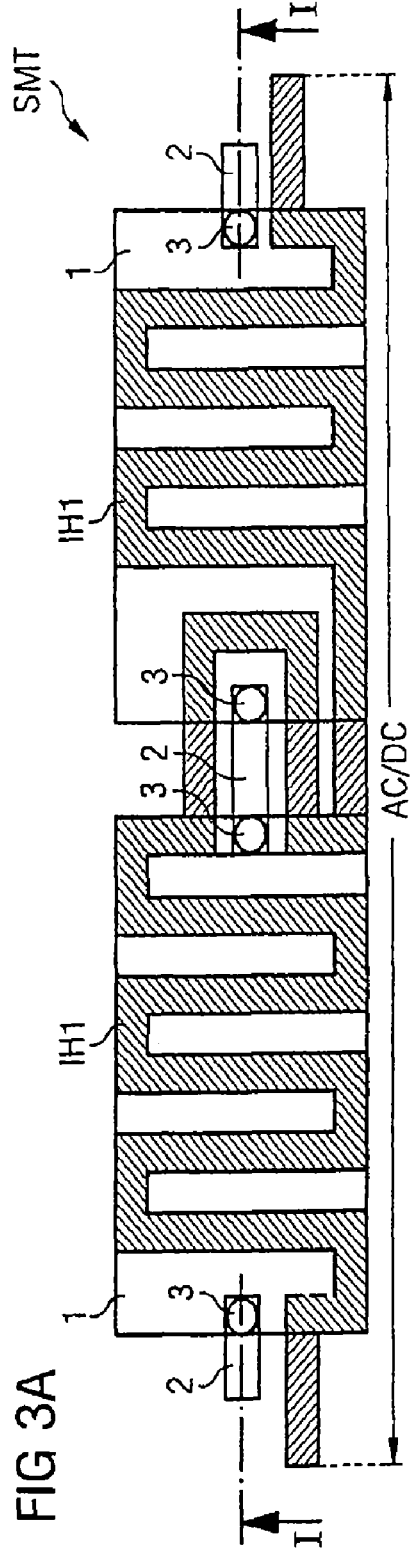
FIG. 3A shows a simplified plan view of a device for detecting stress migration properties in accordance with a first exemplary embodiment.

FIG. 3A shows a simplified plan view and FIG. 3B a perspective sectional view along a section I-I in accordance with FIG. 3A of a device for detecting stress migration properties in accordance with a first exemplary embodiment, identical reference symbols again designating identical or corresponding elements and a repeated description being dispensed with below.

Figure 3B:
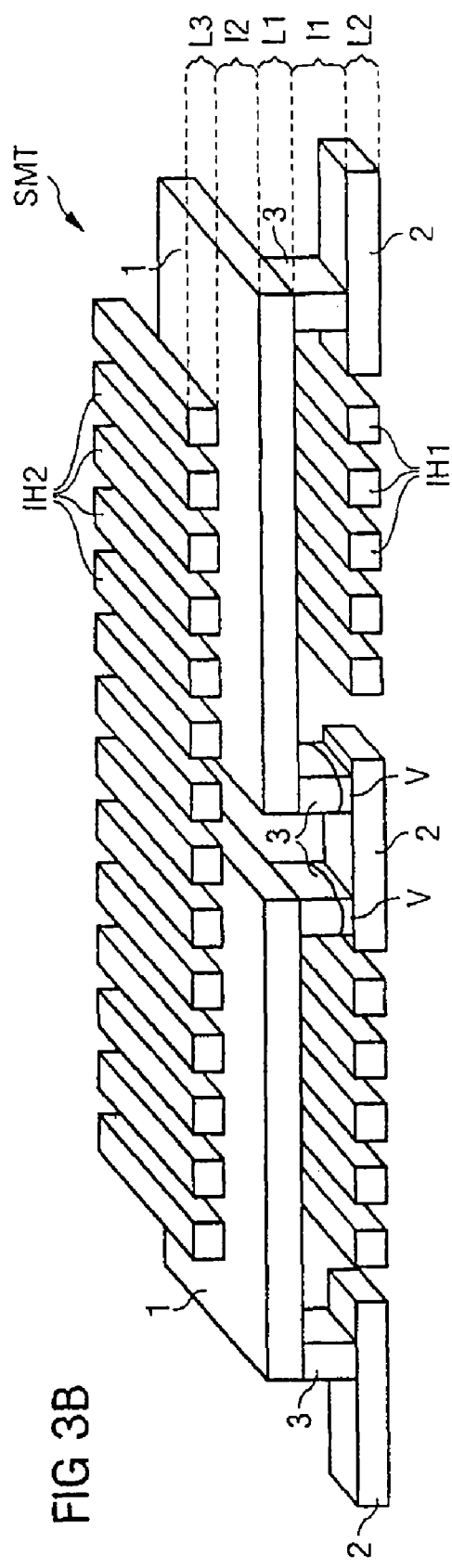
FIG. 3B shows a simplified perspective view of the device in accordance with FIG. 3A along a section I-I.

In accordance with FIGS. 3A and 3B, the stress migration test structure SMT has, in a first interconnect layer or metallization plane L1, two first interconnect regions 1 formed as conductor boards with a relatively large surface for optimally taking up mechanical stresses and/or volume for forming or providing vacancies. Three second interconnect regions 2 are formed in a second interconnect layer or metallization plane L2. The second interconnect regions 2 electrically connect the first interconnect regions 1 to one another by means of connecting regions 3 in contact holes or vias. The connecting regions 3 accordingly connect the first and second interconnect regions 1 and 2 through a corresponding contact hole or via in a first insulating layer I1 lying between the interconnect layers L1 and L2.

In order to improve the sensitivity of the stress migration test structure SMT, at least the surface and/or the volume of the first interconnect regions 1 is significantly larger than a surface and/or a volume of the connecting regions 3. As a result, the material transport caused by stress migration, or voiding, acts principally in the connecting regions 3. These voids formed as a result of the stress migration are designated by V in the connecting regions 3.

In the stress migration test structure SMT in accordance with the first exemplary embodiment according to FIGS. 3A and 3B, the first interconnect regions 1 have a significantly larger surface and/or volume than the second interconnect regions 2, in which case the second interconnect regions 2 may also have a correspondingly large surface and/or volume. In the exemplary embodiment illustrated, however, the second interconnect regions 2 are also outstandingly suitable for an internal heating device that is described later.

In accordance with FIGS. 3A and 3B, the stress migration test structure SMT accordingly comprises a multiplicity of first interconnect regions 1 and a multiplicity of second interconnect regions 2, which are connected to one another in concatenated fashion by means of a multiplicity of connecting regions 3. This concatenated structure results in a further improvement of the statistical significance for detecting stress migration properties in a semiconductor module.

To locally heat the stress migration test structure SMT, in the first exemplary embodiment in accordance with FIGS. 3A and 3B, an integrated heating device in the form of interconnect structures which heat up is formed outside the first interconnect regions 1 and the second interconnect regions 2 or the connecting regions 3.

In accordance with FIGS. 3A and 3B, a conductor strip IH1 patterned in meandering form, by way of example, is formed in the second interconnect layer L2 below the first interconnect regions 1 and between the second interconnect regions 2. The conductor strip IH1 can be heated with a heating current through Joule heating. The heating current of this lower integrated heating device IH1 may be for example an alternating current or a direct current AC/DC.

Furthermore, in accordance with FIG. 3B, an upper integrated heating device IH2 may also be formed in an interconnect layer L3, which is spaced apart by a second insulating layer I2 and accordingly lies above the first interconnect layer L1. The upper heating device IH2 may again be patterned in meandering form, by way of example. Heating is effected by means of a direct or alternating current in this case in the same way as in the case of the lower integrated heating device IH1.

Each of the integrated heating device IH1 and IH2 has a polycrystalline semiconductor material and in particular polysilicon, as a result of which particularly good heat conducting properties are obtained. However, metal materials may also be used in the same way. The temperatures generated in the lower and upper internal heating device IH1 and IH2 usually lie above 150 degrees Celsius and preferably in a temperature range of from 225 degrees Celsius to 300 degrees Celsius. As a result, the stress migration can be optimally accelerated, in particular in the first interconnect regions 1, without in the process causing a significant change in the stresses $\sigma_0$ in the semiconductor module IC and in particular the stresses $\sigma_G$ brought about by the plastic housing G.

Particularly, when using silicon as semiconductor material for the semiconductor module IC, the good heat conducting properties of silicon give rise to an exclusively local heating which is restricted only to a very small region directly in the vicinity of the stress migration test structure SMT.

Figure 4A:
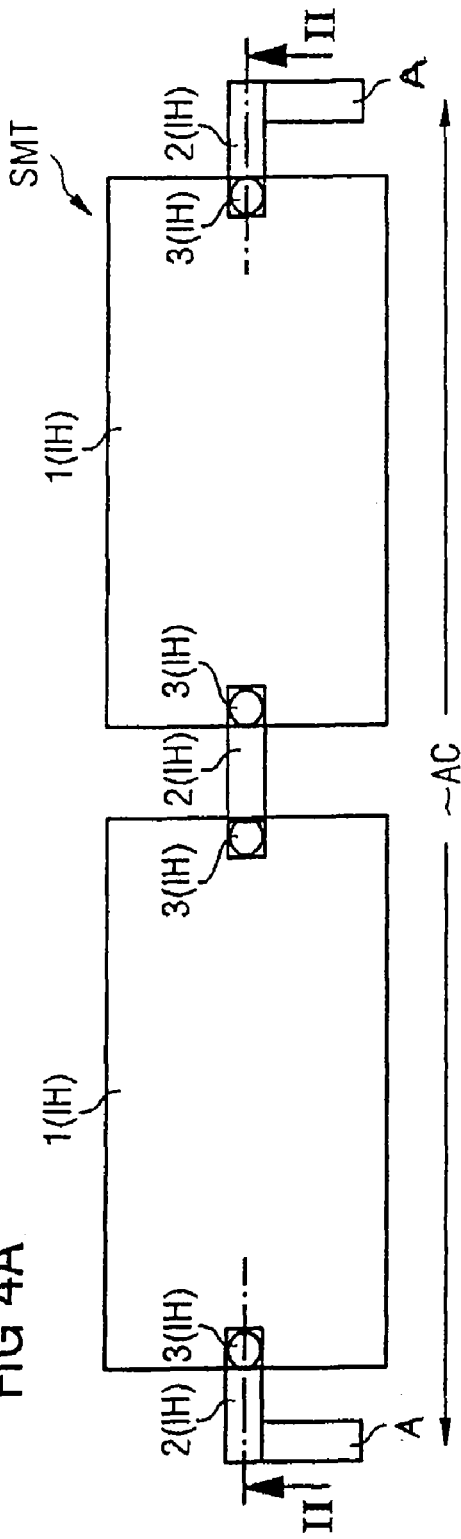
FIG. 4A shows a simplified plan view of a device for detecting stress migration properties in accordance with a second exemplary embodiment.

FIG. 4A shows a simplified plan view and FIG. 4B a simplified sectional view along a section II-II in FIG. 4A of a device for detecting stress migration properties in accordance with a second exemplary embodiment, identical reference symbols designating elements identical or corresponding to those in FIGS. 3A and 3B and a repeated description being dispensed with below.

Figure 4B:
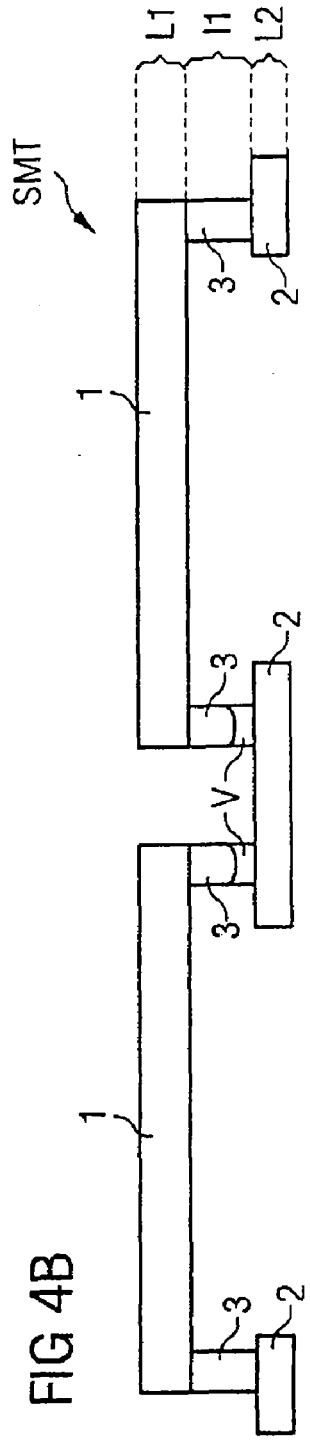
FIG. 4B shows a simplified sectional view of the device in accordance with FIG. 4A along a section II-II.

In accordance with FIGS. 4A and 4B, the stress migration test structure again has the same construction as the stress migration test structure in accordance with the first exemplary embodiment, but now the integrated heating device is formed directly in or within the stress migration test structure SMT. That is, the heating device in accordance with the second exemplary embodiment has an internal heating interconnect region IH within the at least first interconnect region 1 or the second interconnect region 2 or the connecting regions 3, a heating current AC flowing through the heating interconnect region IH. The heating current AC preferably has a high alternating-current component, and it preferably contains only alternating-current components. In this way, it is possible to prevent undesirable electromigration caused by direct current, which would impair measurement accuracy in the detection of the desired stress migration properties.

In accordance with FIGS. 4A and 4B, the heating current AC is applied by means of connection regions A directly to the outermost second interconnect regions 2 of the stress migration test structure SMT formed in concatenated fashion. In this case, in particular given the illustrated patterning of the second interconnect regions 2 with their relatively small surfaces and/or volume and given the use of interconnect materials of the same type, Joule heating principally takes place in the second interconnect regions 2, and the first interconnect regions 1 scarcely contribute to the heating, but are heated through thermal conduction.

In accordance with FIG. 4B, a void V arises in this way once again on account of stress migration in particular in the connecting regions 3. The void V may lead to deterioration of the electrical conductivity or, in the extreme case, to interruption of the connection. Since, in accordance with this second exemplary embodiment, heating current also flows through the connecting regions 3, the heating current AC should contain as far as possible no direct-current component, to avoid damage due to electromigration.

FIG. 5 shows a simplified plan view of a stress migration test structure SMT in accordance with a third exemplary embodiment, identical reference symbols again designating elements identical or corresponding to those in FIGS. 3 and 4 and a repeated description being dispensed with below.

In this case, the device in accordance with FIG. 5 essentially corresponds to the device in accordance with the second exemplary embodiment, the internal heating device IH again being formed within or as part of the stress migration test structure.

In contrast to FIGS. 4A and 4B, however, rather than the entire stress migration test structure SMT being loaded with a heating current AC and thus heating through Joule heating, only a second interconnect region 2 lying between the first interconnect regions 1 is connected to the heating current AC by means of connection regions A. Consequently, the structure is heated only in this second interconnect region 2 lying between the first interconnect regions 1. As a result, electrical loading of the connecting regions or vias 3 can be avoided. On account of the sufficient thermal conduction, these directly adjoining interconnect regions 3 are nevertheless heated sufficiently by the lower or second interconnect layer L2, such that a sufficiently accelerated stress migration is obtained. The heating current AC should once again contain as far as possible no direct-current component to avoid damage due to electromigration.

The interconnect or metallization materials respectively available in semiconductor modules may be used as materials for the respective interconnect layers and connecting regions. In particular, copper and/or aluminum may be used as materials for the interconnect layers and copper, and aluminum or tungsten may be used for the connecting regions.

With regard to the method for detecting stress migration properties of a semiconductor module finally mounted in a product-relevant housing, the above-described stress migration test structures with their respective internal integrated heating devices, or integrated heating devices formed directly in the vicinity, are formed in the semiconductor module, the semiconductor module subsequently being mounted on a module carrier T, which preferably constitutes a lead frame of a flip-chip housing. Afterward, the product-relevant housing is formed preferably by means of a plastic injection-molding method and, after the plastic has cooled and hardened, the actual reliability examination is carried out in the finally mounted state. In this case, a heating current is applied to the integrated heating device and, to detect the stress migration properties of the semiconductor module, a measurement voltage is applied to the stress migration test structure and a current flowing through the stress migration test structure is measured. In this case, the application of the heating current and the application of the measurement voltage may be carried out simultaneously or temporally separately from one another, thereby obtaining a further simplification of the test method and acceleration.

The invention has been described above on the basis of a semiconductor module packaged in a flip-chip housing. However, it is not restricted thereto and encompasses all further product-relevant housings in the same way. In the same way, the stress migration test structure is not restricted to the form illustrated, but rather encompasses all alternative forms and configurations in the same way, an integrated heating device within or in direct proximity to the stress migration test structure bringing about a local heating.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for detecting stress migration properties of a semiconductor module finally mounted in a product-relevant housing, the method comprising
   a) forming a detection device in a semiconductor module, the detection device comprising a stress migration test structure, which is formed in the semiconductor module, and an integrated heating device, which is formed within or in direct proximity to the stress migration test structure in the semiconductor module;
   b) mounting the semiconductor module on a module carrier;
   c) forming a product-relevant housing around the mounted semiconductor module;
   d) applying a heating current to the integrated heating device; and
   e) applying a measurement voltage to the stress migration test structure and measuring a current through the stress migration test structure to detect stress migration properties of the semiconductor module.

2. The method as claimed in claim 1, wherein a flip-chip carrier is mounted as the module carrier.

3. The method as claimed in claim 1, wherein a plastic injection-molding method is carried out.

4. The method as claimed in claim 1, wherein the heating current generates a local temperature of greater than 150 degrees Celsius.

5. The method as claimed in claim 1, wherein the heating current generates a local temperature of from 225 degrees Celsius to 300 degrees Celsius.

6. The method as claimed in claim 1, wherein d) and e) are carried out simultaneously.

7. The method as claimed in claim 1, wherein d) and e) are carried out temporally separately from one another.

* * * * *